(12) United States Patent
Kulkarni

(10) Patent No.: US 12,081,203 B2
(45) Date of Patent: Sep. 3, 2024

(54) METHOD AND SYSTEM FOR SHORT TO GROUND PROTECTION FOR A CIRCUIT INCLUDING A FET DEVICE

(71) Applicant: HORIZON GLOBAL AMERICAS INC., Plymouth, MI (US)

(72) Inventor: Chandrakumar D. Kulkarni, Plymouth, MI (US)

(73) Assignee: HORIZON GLOBAL AMERICAS INC., Plymouth, MI (US)

( * ) Notice: Subject to any disclaimer, the term of this patent is extended or adjusted under 35 U.S.C. 154(b) by 193 days.

(21) Appl. No.: 17/440,898

(22) PCT Filed: Mar. 23, 2020

(86) PCT No.: PCT/US2020/024189
§ 371 (c)(1),
(2) Date: Sep. 20, 2021

(87) PCT Pub. No.: WO2020/191395
PCT Pub. Date: Sep. 24, 2020

(65) Prior Publication Data
US 2022/0166421 A1    May 26, 2022

Related U.S. Application Data

(60) Provisional application No. 62/821,472, filed on Mar. 21, 2019.

(51) Int. Cl.
*H03K 17/08* (2006.01)
*H03K 17/082* (2006.01)
*H03K 17/18* (2006.01)

(52) U.S. Cl.
CPC ......... *H03K 17/0822* (2013.01); *H03K 17/18* (2013.01); *H03K 2217/0027* (2013.01)

(58) Field of Classification Search
CPC ............... H03K 17/0822; H03K 17/18; H03K 2217/0027
See application file for complete search history.

(56) References Cited

U.S. PATENT DOCUMENTS 3,219,762 A    11/1965   Abbott
3,903,465 A     9/1975   Bamoto et al.
(Continued)

OTHER PUBLICATIONS

Patent Cooperation Treaty (PCT), International Search Report and Written Opinion for Application PCT/US2020/024189 filed Mar. 23, 2020, mailed Aug. 4, 2020, International Searching Authority, US.

*Primary Examiner* — Adolf D Berhane
*Assistant Examiner* — Afework S Demisse

(57) ABSTRACT

A diagnostic circuit for an electronic control unit comprises a field-effect transistor device, a comparator circuit, and a microprocessor. The diagnostic circuit detects a short to ground detection and turns off the field-effect transistor device. The diagnostic circuit may include redundant or dual short to ground protection for a field-effect transistor device. The comparator circuit generates an interrupt signal based on comparing a sensed parameter of an output signal of the field-effect transistor device to a threshold value. The microprocessor samples output from the field-effect transistor device and compares the sampled output to a power limit threshold. The microprocessor turns off the field-effect transistor device based on receiving the interrupt signal or comparison of the sampled output to the power limit threshold. Detection or prevention of a short to ground protects the field-effect transistor device.

20 Claims, 6 Drawing Sheets

(56) References Cited

U.S. PATENT DOCUMENTS

| | | | |
|---|---|---|---|
| 5,352,028 | A | 10/1994 | Eccleston |
| 6,205,010 | B1 | 3/2001 | Ohsaka et al. |
| 6,325,466 | B1 * | 12/2001 | Robertson ............... B60T 13/74 |
| | | | 303/7 |
| 6,516,925 | B1 | 2/2003 | Napier et al. |
| 2014/0346974 | A1 | 11/2014 | Phoseon |
| 2018/0154874 | A1 * | 6/2018 | Kulkarni ............. H01M 8/1004 |

* cited by examiner

Table 8. Protection and diagnostics[1]

| Symbol | Parameter | Test conditions | Min. | Typ. | Max. | Unit |
|---|---|---|---|---|---|---|
| $I_{IMH}$ | Short-circuit current | $V_{CC} = 13\text{ V}$ | 60 | 85 | 120 | A |
| | | $5\text{ V} < V_{CC} < 28\text{ V}$ | | | 120 | |
| $I_{IIMH}$ | Short-circuit current during thermal cycling | $V_{CC} = 13\text{ V}$; $T_R < T_J < T_{SD}$ | | 21 | | A |
| $T_{TSD}$ | Shutdown temperature | | 150 | 175 | 200 | °C |
| $T_R$ | Reset temperature | | $T_{RS} + 1$ | $T_{RS} + 5$ | | °C |
| $T_{RS}$ | Thermal reset of status | | 135 | | | °C |
| $T_{HYST}$ | Thermal hysteresis ($T_{TSD} - T_R$) | | | 7 | | °C |
| $V_{DEMAG}$ | Turn-off output voltage clamp | $I_{OUT} = 2\text{ A}$; $V_{IN} = 0$; $L = 6\text{ mH}$ | $V_{CC} - 41$ | $V_{CC} - 46$ | $V_{CC} - 52$ | V |
| $V_{ON}$ | Output voltage drop limitation | $I_{OUT} = 0.5\text{ A}$; $T_J = -40\text{ °C to } 150\text{ °C}$ | | 25 | | mV |

1. To ensure long term reliability under heavy overload or short-circuit conditions, protection and related diagnostic signals must be used together with a proper software strategy. If the device is subjected to abnormal conditions, this software must limit the duration and number of activation cycles FIG. 1B
(Prior Art)

METHOD AND SYSTEM FOR SHORT TO GROUND PROTECTION FOR A CIRCUIT INCLUDING A FET DEVICE

CROSS-REFERENCE TO RELATED APPLICATION

This application is a 35 U.S.C. 371 national stage filing of PCT Application No. PCT/US20/24189 filed Mar. 23, 2020 and entitled "METHOD AND SYSTEM FOR SHORT TO GROUND PROTECTION FOR A CIRCUIT INCLUDING A FET DEVICE," which claims priority to U.S. Provisional Patent Application No. 62/821,472, filed Mar. 21, 2019 and entitled "METHOD AND SYSTEM FOR SHORT TO GROUND PROTECTION FOR A CIRCUIT INCLUDING A FET DEVICE," each of which are incorporated herein by their entireties.

FIELD OF THE INVENTION

The present invention relates generally to diagnostic circuits and microcontrollers, and more specifically, to a system for detecting a short within an electrical system associated with electronic control units and systems.

BACKGROUND OF THE INVENTION

Field-Effect transistors (FETs) are utilized in many electronic controllers for switching or amplifying signals. Particularly, a type of FET called a Metal Oxide Semiconductor Field Effect Transistors (MOSFET) which is a voltage controlled semiconductor device that typically includes a plurality of terminals such as a gate, a drain, and a source in which various loads are applied to control current flow between the drain terminal and the source terminal. MOSFETS may be used as high-side switches in automobile applications to drive resistive, inductive, and capacitive grounded loads in compliance with safety and reliability requirements of electronic control applications.

Some manufacturers use a Smart-FET or MOSFET device that includes protection for a short to ground circuit and for over temperature protection. Smart-FETs or MOSFETs can be used in driving various loads in automotive applications including for driving the brake magnets of a trailer, controlling lights, motors, etc. These types of systems may even be used in brake controller units that provide a brake output signal to the brakes of a towed vehicle have been proposed and/or manufactured. One example of such a brake control unit is provided by U.S. Pat. No. 8,746,812 which is incorporated by reference in its entirety.

Generally, Smart-FETs include a built in charge pump and current sense output wherein the output of current sense may be proportional to the load current. When a condition such as short to ground occurs on the output, there is an excessive current flow. This would cause the FET to limit the current, overheat, and shutdown. Smart-FETs may have built in current limiting protection for excessive current flow or high temperatures. One example of such FET is model number VN5E010AH provided by STMicroelectronics. FIG. 1A illustrates the known Smart-FET device while FIG. 1B is a table that illustrates various parameters in which protection and diagnostics have been known to be implemented as is associated with the aforementioned FET device. The manufacturer explains that load current limitation is provided to limit inrush and overload events.

However, currently known protective applications for Smart-FET devices have been known to be subject to a delay in sensing a short to ground event. Delay may cause a device to overheat, which may limit the useful operating life of a FET device. See FIG. 1C. Further, such protections are known to include diagnostic functions and overcurrent protection that are at risk for generating too much heat and eventually failing over the useful life of the Smart-FET device. Because of this problem, such manufacturers apply additional circuitry that protects the electronic control units, such as a switch S in series with the FET or MOSFET device. In application, when a failure of the MOSFET is detected, the series switch may be opened and the source of supply to the failed MOSFET may be removed. Alternatively, as shown in FIG. 2, some manufacturers apply external circuitry such as a charge pump for a high-side driver and an external current sense circuit. The charge pump is a kind of electrical converter that utilized capacitors for the storage of energetic charges to raise voltages. In these instances, the system requires additional external circuitry to include components as well as a requirement to continually monitor such components to ensure they are working properly. Moreover, the current is sensed via polling at predetermined intervals, so any fault detection may be delayed. This may be true if a short occurs after the FET is turned on.

Although such parts, such as Smart-FET devices, limit the current and protect themselves when they overheat, the number of times they can be turned on with output shorted to ground is limited. The life of the FET is limited under these conditions and it may not last over the required life of the automotive electronic control unit. Moreover, the mode of failure is not defined and may cause excessive and uncontrolled heat after the failure under the conditions of a short circuit to ground on the output side and may result in damage caused by excessive heat or even cause fire to occur to the surroundings.

In view of these shortcomings, there is a need for a diagnostic circuit does not involve extraneous components or equipment that solves the above noted deficiencies as well as other deficiencies that may be apparent herein.

SUMMARY OF THE INVENTION

Provided is a diagnostic circuit for an electronic control unit comprising a field-effect transistor device operatively coupled to a power source; a comparator circuit coupled to the field-effect transistor and operatively receiving a sensed parameter of a first output signal of the signal field-effect transistor, wherein the comparator circuit compares the sensed parameter to a reference value and generates an interrupt signal in response to the sensed parameter exceeding the reference value; and a microprocessor coupled to the comparator circuit and the field-effect transistor device, wherein the microprocessor, in response to receiving the interrupt signal, shuts of the field-effect transistor device. The sensed parameter may comprise a sensed voltage and the reference value comprises a reference voltage, and wherein the comparator circuit compares the sensed voltage to the reference voltage. In an aspect, the field-effect transistor device generates the first output signal with the sensed parameter that exceeds the reference value when a short to ground condition occurs. It is noted that the microprocessor may be further coupled to an output pin of the field-effect transistor device to receive a second output signal of the field-effect transistor device. The microprocessor may sample the second output signal to determine whether a short to ground condition has occurred, and, in response to determining that the short to ground condition has occurred, turns off the field-effect transistor device, determining whether the short to ground condition has occurred may comprise comparing the sampled second output signal to a power limit threshold value. In an example, the microcontroller samples the second output signal after the field-effect transistor device is placed in the on mode. According to an aspect, the field-effect transistor device comprises a field-effect transistor device of at least one of a trailer brake control circuit, a light control circuit, or an antilock brake control circuit. The microcontroller further may further comprise a memory, wherein the memory stores executable instructions that, when executed, enables the microcontroller to communicate over an automotive bus system. It is noted that the comparator circuit may be comprised by at least one of the microcontroller or the field-effect transistor device. In another aspect, the microcontroller, in response to turning off the field-effect transistor device, turns the field-effect transistor device on after a period of time and reiterates shutting off the field-effect transistor device if an interrupt signal is received. The period of time may comprise ten milliseconds. In another aspect, the microcontroller further iterates turning the field-effect transistor device on and off for a threshold amount of periods, and in response to reaching the threshold amount of periods with a ground to short condition maintained, utilizes an alternative period that is greater in length than the period.

Also described is a system for diagnosing and protecting a field-effect transistor device from a short to ground event comprising a diagnostic circuit that comprises a field-effect transistor device operatively coupled to a power source and a driven device, wherein the field-effect transistor device operatively delivers a load to the driven device, a comparator circuit coupled to an output channel of the field-effect transistor device, and a microprocessor coupled to the comparator circuit and the field-effect transistor device. In implementations, the microprocessor receives input from the field-effect transistor device and the comparator circuit, and the microprocessor determines whether a short to ground condition is present based the input received from at least one of from the field-effect transistor device or the comparator circuit, and in response turns off the field-effect transistor device within a threshold time. The threshold time may be between about 100 microseconds and 500 microseconds. The microcontroller may turn off the field-effect transistor device by disabling a drive signal to the field-effect transistor device. It is noted that the microprocessor may determine whether the short to ground condition is present prior to turning the field-effect transistor device on and after turning the field-effect transistor device on. Additionally or alternatively, the comparator may generate an interrupt signal based on determining that a sensed voltage of an output signal of the field-effect transistor device exceeds a threshold voltage. In some examples, the threshold voltage is about 3 volts. The field-effect transistor device may comprise a smart field-effect transistor device or other field-effect transistor device.

This disclosure also describes method of detecting a short to ground condition in a circuit comprising a field-effect transistor device. The method may comprise providing a diagnostic circuit comprising a field-effect transistor device, a comparator circuit, and a processor; sensing, by the comparator, a voltage of an output of the field-effect transistor device; comparing, by the comparator, the voltage to a threshold value and generating an interrupt signal based on the comparison; sampling, by the processor, output from the field-effect transistor device; and determining, by the processor, whether the short to ground condition has occurred, based on at least one of receiving the interrupt signal or a comparison of the sampled output of the field-effect transistor device to a power limit threshold value. It is noted that the method may further comprise generating, by the processor, a command to instruct a display device to indicate an error condition has occurred in response to the processor determining that the short to ground condition has occurred. In another aspect, the method may comprise turning of the field-effect transistor device by the processor in response to determining that the short to ground condition has occurred. The method may also comprise providing the diagnostic circuit within an electronic control unit of an automobile.

A diagnostic circuit for an electronic control unit may comprise a field-effect transistor device operatively coupled to a power source and comprising a current sense output and a comparator circuit coupled to the field-effect transistor and operatively receiving a sensed parameter of a first output signal of the signal field-effect transistor, wherein the comparator circuit compares the sensed parameter to a reference value and generates an interrupt signal in response to the sensed parameter exceeding the reference value. The diagnostic circuit for an electronic control unit may further comprise a microprocessor coupled to the comparator circuit and the field-effect transistor device, wherein the microprocessor, in response to receiving the interrupt signal, shuts of the field-effect transistor device.

The diagnostic circuit may include any of the foregoing in any combination or may include all of the foregoing:
- wherein the sensed parameter comprises a sensed voltage and the reference value comprises a reference voltage, and wherein the comparator circuit compares the sensed voltage to the reference voltage.
- wherein the field-effect transistor device generates the first output signal with the sensed parameter that exceeds the reference value when a short to ground condition occurs.
- wherein the microprocessor is further coupled to an output pin of the field-effect transistor device to receive a second output signal of the field-effect transistor device.
- wherein the microprocessor samples the second output signal to determine whether a short to ground condition has occurred, and, in response to determining that the short to ground condition has occurred, turns off the field-effect transistor device.
- wherein determining whether the short to ground condition has occurred comprises comparing the sampled second output signal to a power limit threshold value.
- wherein the microcontroller samples the second output signal after the field-effect transistor device is placed in the on mode.
- wherein the field-effect transistor device comprises a field-effect transistor device of at least one of a trailer brake control circuit, a light control circuit, or an antilock brake control circuit.
- the microcontroller further comprises a memory, wherein the memory stores executable instructions that, when executed, enables the microcontroller to communicate over an automotive bus system.
- wherein the comparator circuit is comprised by at least one of the microcontroller or the field-effect transistor device.
- wherein the microcontroller, in response to turning off the field-effect transistor device, turns the field-effect transistor device on after a period of time and reiterates shutting off the field-effect transistor device if an interrupt signal is received.
- wherein the period of time comprises ten milliseconds.

wherein the microcontroller further iterates turning the field-effect transistor device on and off for a threshold amount of periods, and in response to reaching the threshold amount of periods with a ground to short condition maintained, utilizes an alternative period that is greater in length than the period.

A system for diagnosing and protecting a field-effect transistor device from a short to ground event may comprise a diagnostic circuit that comprises: a field-effect transistor device operatively coupled to a power source and a driven device, wherein the field-effect transistor device operatively delivers a load to the driven device; a comparator circuit coupled to an output channel of the field-effect transistor device; and a microprocessor coupled to the comparator circuit and the field-effect transistor device, wherein the microprocessor receives input from the field-effect transistor device and the comparator circuit, and wherein the microprocessor determines whether a short to ground condition is present based the input received from at least one of from the field-effect transistor device or the comparator circuit, and in response turns off the field-effect transistor device within a threshold time.

The system may include any of the foregoing in any combination or may include all of the foregoing:
- wherein the threshold time is between about 100 microseconds and about 500 microseconds.
- wherein the microcontroller turns off the field-effect transistor device by disabling a drive signal to the field-effect transistor device.
- wherein the microprocessor determines whether the short to ground condition is present prior to turning the field-effect transistor device on and after turning the field-effect transistor device on.
- wherein the comparator generates an interrupt signal based on determining that a sensed voltage of an output signal of the field-effect transistor device exceeds a threshold voltage.
- wherein the threshold voltage is about 3 volts.
- wherein the field-effect transistor device comprises a smart field-effect transistor device.

A method of detecting a short to ground condition in a circuit comprising a field-effect transistor device that may comprise providing a diagnostic circuit comprising a field-effect transistor device, a comparator circuit, and a processor, sensing, by the comparator, a voltage of an output of the field-effect transistor device and comparing, by the comparator, the voltage to a threshold value and generating an interrupt signal based on the comparison. The method may also comprise sampling, by the processor, output from the field-effect transistor device, and determining, by the processor, whether the short to ground condition has occurred, based on at least one of receiving the interrupt signal or a comparison of the sampled output of the field-effect transistor device to a power limit threshold value.

The method may include any of the foregoing in any combination or may include all of the foregoing:
- generating, by the processor, a command to instruct a display device to indicate an error condition has occurred in response to the processor determining that the short to ground condition has occurred.
- turning of the field-effect transistor device by the processor in response to determining that the short to ground condition has occurred.
- providing the diagnostic circuit within an electronic control unit of an automobile.

These and other features, advantages, and objects of the present invention will be further understood and appreciated by those skilled in the art by reference to the following specification, claims, and appended drawings.

DESCRIPTION OF THE DRAWINGS

Objects and advantages together with the operation of the present teaching may be better understood by reference to the following detailed description taken in connection with the following illustrations, wherein:

FIG. 1B is a table that illustrates various parameters in which protection and diagnostics have been known to be implemented as is associated with the FET device of FIG. 1A;

DETAILED DESCRIPTION

Figure 1A:
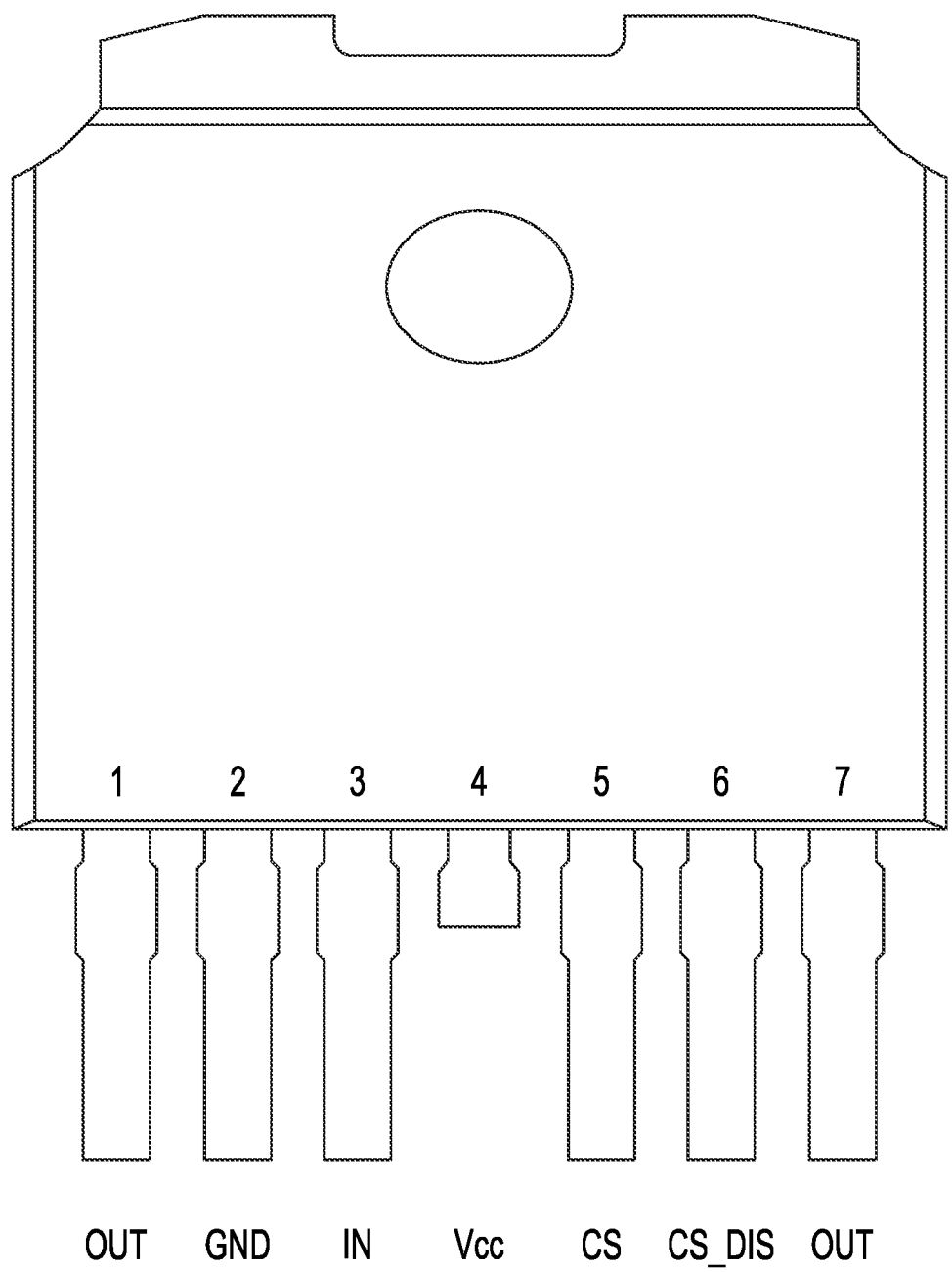
FIG. 1A is a plan view of a prior art Smart-FET device provided by STMicroelectronics.

Reference will now be made in detail to exemplary embodiments of the present teachings, examples of which are illustrated in the accompanying drawings. It is to be understood that other embodiments may be utilized and structural and functional changes may be made without departing from the respective scope of the present teachings. As such, the following description is presented by way of illustration only and should not limit in any way the various alternatives and modifications that may be made to the illustrated embodiments and still be within the spirit and scope of the present teachings.

As used herein, the words "example" and "exemplary" mean an instance, or illustration. The words "example" or "exemplary" do not indicate a key or preferred aspect or embodiment. The word "or" is intended to be inclusive rather an exclusive, unless context suggests otherwise. As an example, the phrase "A employs B or C," includes any inclusive permutation (e.g., A employs B; A employs C; or A employs both B and C). As another matter, the articles "a" and "an" are generally intended to mean "one or more" unless context suggest otherwise.

Disclosed herein is a diagnostic circuit that includes dual short to ground protection for a FET device. The disclosed system and method may allow for the detection or prevention of a short to ground to affect the useful life of the FET device that may allow for the FET device to experience over about 5 million or even over 8 million samplings and have a useful life of about over about 10 years in normal operating conditions for automotive applications. It is noted that the number of samplings and useful life may be different based on the application of use, manufacture of the FET, or the like. These data points may be the minimum sampling requirements of the FET device in a circuit as the disclosed diagnostic circuit may sufficiently provide circuit protection to allow the FET device to have a perpetual life span. As such, the disclosed embodiments provide for an improved circuit that achieves unexpectedly improved results where others have failed. The disclosed diagnostic circuit further provides fast detection that may generate an immediate interrupt signal to shut off a drive signal (e.g., disable, terminate, etc.) and may be configured to sample or retry the application of a current load every second until the existence of a short to ground of fault has been removed from the circuit. In addition, embodiments may utilize a comparator circuit as an internal or external component to a microcontroller or a FET device.

In embodiments, a diagnostic circuit may include a comparator circuit coupled to a FET device. The comparator circuit may compare sensed voltage to a voltage threshold and generate an interrupt signal based on the comparison. The diagnostic circuit may further include or be coupled with a microcontroller. The microcontroller may receive input from the comparator circuit, such as the interrupt signal. Additionally or alternatively, the microcontroller may sample the output of the FET device. The microcontroller may compare the output voltage of the FET device to a threshold. Based on the interrupt signal or the comparison of the output voltage of the FET device, the microcontroller may determine whether to turn off the FET device. In another aspect, the microcontroller may determine whether an error condition has occurred and may control a display (e.g., generate a signal to control a display) to identify an error condition.

Stated another way, embodiments described herein may utilize a comparator circuit when a load current is equal to or less than a current limit of a Smart-FET (e.g., 85 Amps for the device VN5E010). The Smart-FET Output voltage sampling (microcontroller sampling condition) may be used when the load current is greater than the current limit of the Smart-FET. The comparator circuit may be applicable for any load current of conventional FET device or for any load current. The threshold of the comparator circuit may be set at the current sense circuit output voltage corresponding to a maximum load current plus a maximum inrush current of a driven device such as an incandescent lamp (i.e., 10 times typical current), vehicle brakes, sensor systems, or the like. The driven device may be an incandescent lamp or may be any other electronic device that is to be controller by an ECU and this disclosure is not limited herein.

Disclosed diagnostic circuits provide fast detection that may generate an immediate interrupt signal to shut off a drive signal and may be configured to sample or retry the application of a current load every second until the existence of a short to ground of fault has been removed from the circuit. In at least one embodiment, a microcontroller may attempt to (or actually) turn on the FET device after a period of time has passed since initially detecting a short to ground condition. This period of time may comprise t milliseconds, where t is a number (e.g., 10, 50, 100, etc.). In an example, the period may relate to a frequency of a drive signal, such as a pulse-width-modulated ("PWM") drive signal having a frequency of t milliseconds. For instance, the PWM signal may comprise a 10 millisecond frequency and the microcontroller may attempt to turn on the FET device after 10 milliseconds.

It is noted that the microcontroller may attempt to turn the FET device on a threshold number of attempts, and then may extend the period or frequency of attempts after reaching the threshold number of attempts. This may reduce the number of times the FET device is polled or turned on and off because of the short to ground condition. In at least one embodiment, the microcontroller turns the FET device on or otherwise checks of the short to ground condition every ten milliseconds and if the short to ground condition is still present after the threshold number of times (e.g., 2, 3, 4, 5, etc.) the microcontroller then uses an alternative period of time (such as 1 second), where the alternative period of time is greater than the initial period of time. As described above, this may reduce the number of times the FET is turned on and off due to a short to ground condition.

Figure 3:
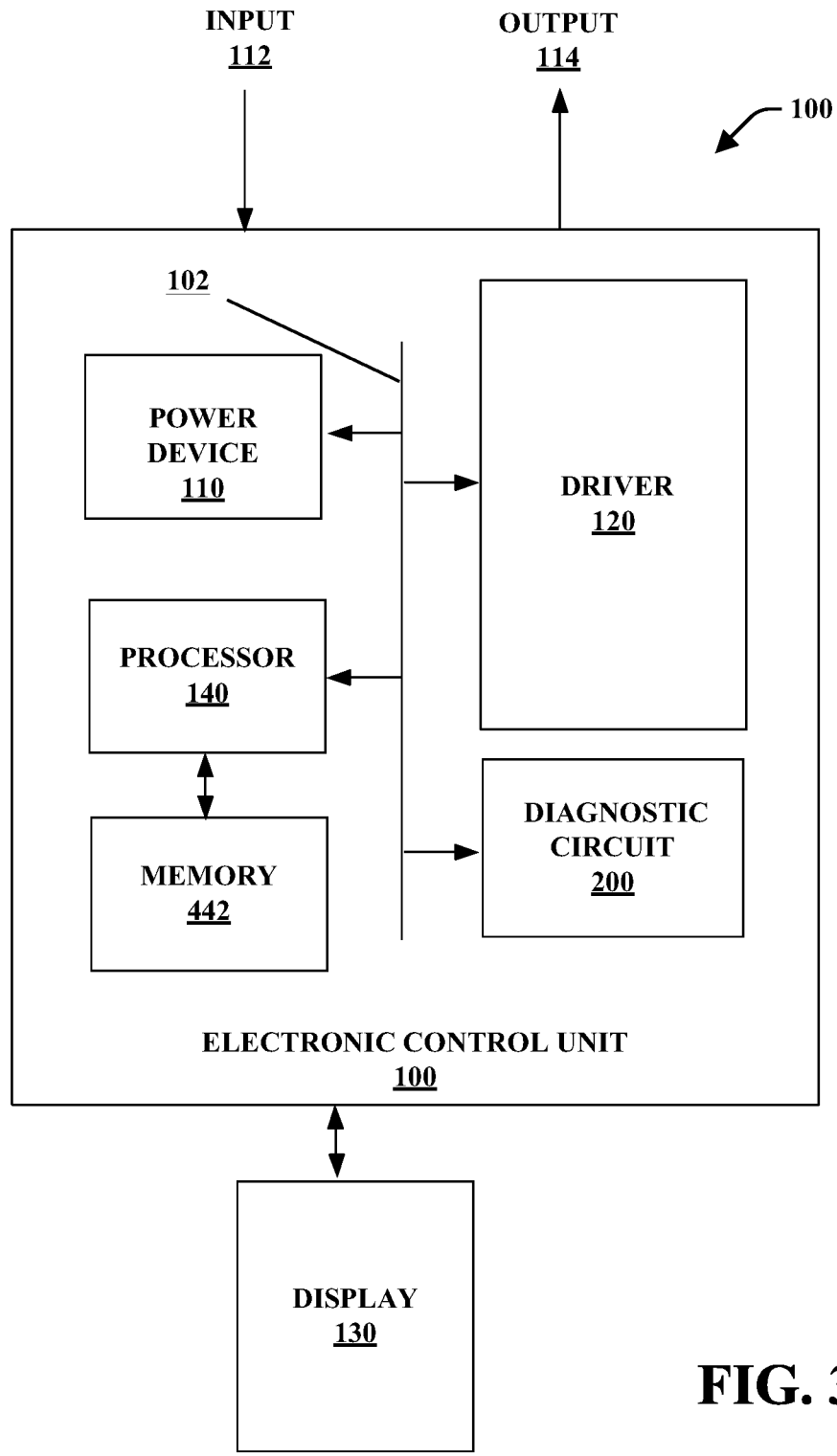
FIG. 3 is a schematic circuitry diagram of the instant disclosure for providing circuitry protection to an electronic control unit.

As shown in the electrical block diagram of FIG. 3, provided is an electronic control unit 100 (ECU) that includes a power device 110 that can receive and send signals to a driver 120. The ECU 100 may include a communication bus 102, such as the high speed controlled area network (HSCAN) bus. For example, the ECU 100 can receive and send signals relating to various control applications including automotive ECUs, brake magnets of a trailer, lights, motors, brake control units, etc. These ECU applications may be able to assist with the control of wheel speeds of the towing and/or towed vehicle, vehicle state information from ABS, brake-on-off, etc. The ECU 100 can also receive signals from various systems related to the towing vehicle, and can also receive a power signal.

For instance, ECU 100 may comprise or be coupled with a brake controller circuit that operatively controls the brakes of a towed vehicle. In an aspect, the brake controller circuit may be a proportional or inertia based system, timer system, or other system. Such brake controller circuits may function as described in exemplary, non-limiting disclosures of U.S. Pat. Nos. 6,012,780; 6,068,352; 6,282,480; 6,445,993; 6,615,125; 8,746,812; 8,789,896; and 9,150,201, the entireties of which are incorporated by reference herein. In another aspect, the brake controller circuit may allow a user to manually control the brakes of a towed or trailing vehicle through a user interface (e.g., slide a switch that controls a potentiometer, buttons, mobile device, remotes, etc.). Moreover, the ECU 100 may comprise or be coupled with circuits that control trailer brake lights, antilock braking systems, vehicle sensor systems and other systems such, for example, systems described in in exemplary, non-limiting disclosures of U.S. Pat. Nos. 9,738,125, 9,428,105 and United States Patent Publication No. 2018/0079375 the entireties of which are incorporated by reference herein.

The ECU 100 may be in communication with a display 130. It should be understood that any sort of display system can be used, such as one or more LEDs, a screen, a wirelessly connected device, a display mounted on a dash of a vehicle, or the like. It is noted that a display system may be a visual, audible, tactile, or combination of systems. For brevity, examples may be described with reference to a "display" in general rather than any particular type of interface. It is noted that embodiments may include multiple displays of various types.

The ECU 100 may drive the display 130 thereof to communicate information such as percentage of a drive signal output, gain value settings, and application connectivity status. Additionally, the display 130 may include an operator notification system to indicate a connected and disconnected state or a short/fault and the particular location that the short/fault that may exist in the electrical system. It is noted that the display 130 may generate error codes, narratives, or the like.

The ECU 100 can be fully integrated with an automotive electrical system. This allows the particular electronic system to be originally installed equipment in a vehicle. In other words, the ECU can be a factory-installed option on the vehicle. In such circumstances, the display 130 and the controls for the ECU may be integrated into the instrument panel of the vehicle. As such, the controls of the ECU may operate similarly to the other controls contained in the vehicle's instrument panel. Alternatively, the ECU 100 may be an aftermarket device capable of being connected to the vehicle. Further, the ECU 100 may be configured to be inserted into the vehicle as an aftermarket component that is inserted into a designated space to make it appear as if it were integrated at time of assembly of the vehicle, as applicable.

Accordingly, the ECU 100 and display 130 may incorporate a mechanism via software and hardware interface to adjust the various features and functionality of the control system. The ECU 100 may be controlled through communication with the display 130 and other elements, such as by wireless or serial communication. Further, to operate the components above, the ECU 100 may include a processor 140. As used herein, the term "processor" may include various hardware processing devices, such as single core or multi-core processing device (e.g., an execution unit with memory, etc., integrated within an integrated circuit). Moreover, processor may refer to a "microprocessor," "controller," "microcontroller," "computing processing unit (CPU)," or the like. Such terms generally relate to a hardware device. Additionally, processor 140 may include a digital signal processor (DSP), a programmable logic device (PLD), a complex programmable logic device (CPLD), an application specific integrated circuit (ASIC), a field programmable gate array (FPGA), a discrete gate or transistor logic, discrete hardware components, or the like.

The processor 140 may be a microprocessor that allows for programmable logic. In this context, "logic" refers to any information and/or data that may be applied to direct the operation of a processor. Logic may be formed from instruction signals stored in a memory (e.g., a non-transitory memory). Software is one example of logic. In another aspect, logic may include hardware, alone or in combination with software. For instance, logic may include digital and/or analog hardware circuits, such as hardware circuits comprising logical gates (e.g., AND, OR, XOR, NAND, NOR, and other logical operations). Furthermore, logic may be programmed and/or include aspects of various devices and is not limited to a single device. The processor may include or be coupled with memory 442. Memory 442 may contain computer executable instructions (e.g., software) which may identify requirements to communicate with the towing vehicle's communication bus (such as the CAN or a high-speed controlled area network (HSCAN)), or other communication systems (such as a local interconnect network (LIN) and a J1850), in-vehicle diagnostics, and required functionality for interpreting vehicle and driver inputs. In at least one example, the processor 140 comprises on-board memory (e.g., memory 442) that contains the software requirements to communicate with the towing vehicle's communication bus, in-vehicle diagnostics, and required functionality for interpreting vehicle and driver inputs. In another aspect, the processor 140 may have the capabilities to provide proper control to the various applications including: brakes of the towed vehicle, towing vehicle stop lamps during a manual braking event, towed vehicle lamps during a manual braking event, brake magnets of a trailer, control of lights of a towed vehicle, motors, etc. and display information accessible to the operator.

As illustrated by FIG. 3, the processor 140 may be operably coupled to the power device 110 and driver 120. The driver 120 may be operable to generate an output signal 114 based on a variety of information received from the vehicle. This vehicle information can be received through hard-wired inputs from a various electronic applications. Additional vehicle provided information can be received through the vehicle's communication bus. In an aspect, the processor 140 may generate signals that may be sent to various circuits within the ECU 100. For instance, the ECU 100 may generate asymmetric signals to be sent to different driving circuits (e.g., such as high side drivers operatively connected to vehicle brakes). Further, the ECU 100 may include a diagnostic circuit 200 in electronic communication with the various components of the ECU 100 that may be interconnected to diagnose potential causes for irregularities and interrupt input loads as will be discussed in reference to FIG. 4.

Figure 4:
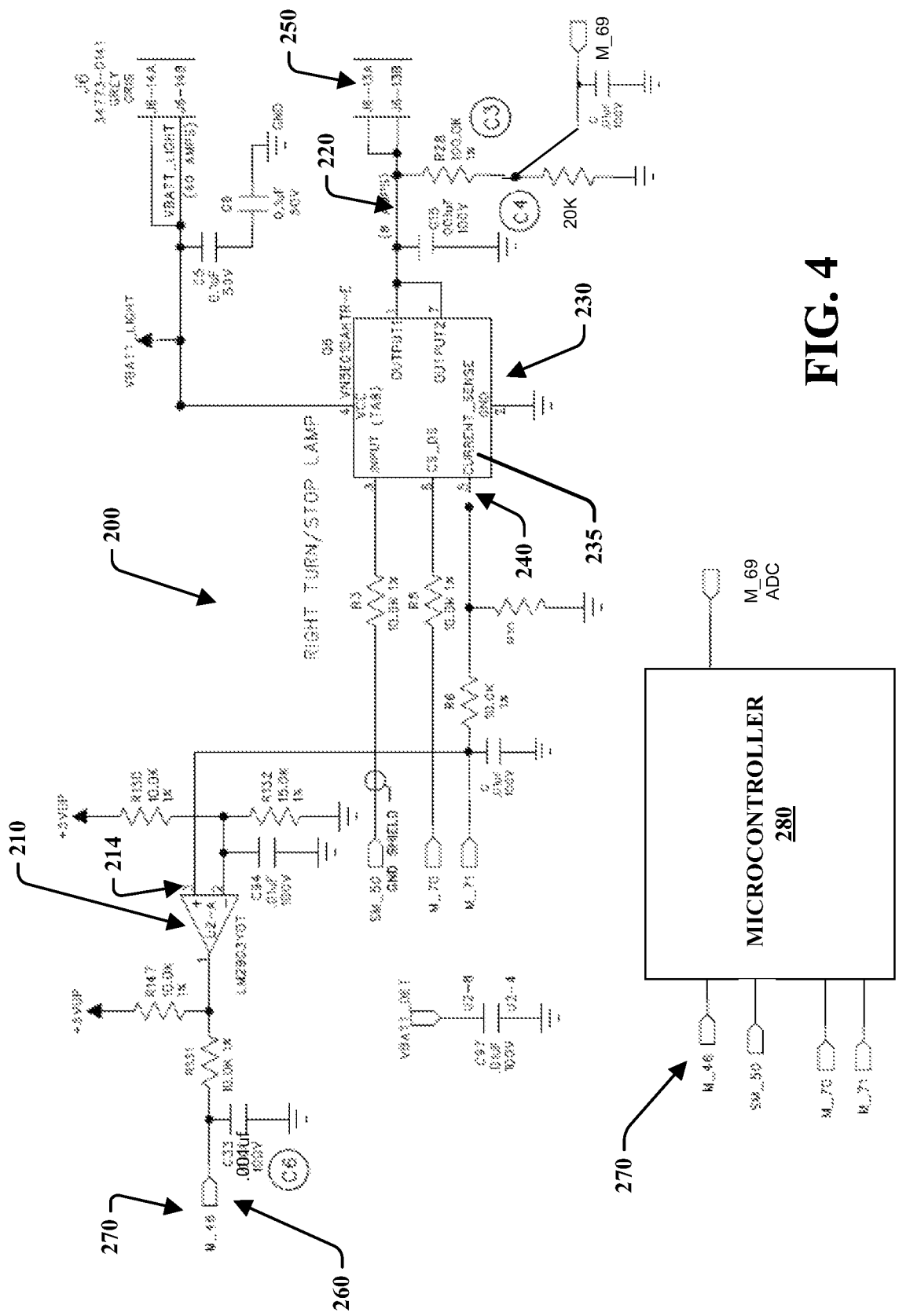
FIG. 4 is a schematic diagram of a diagnostic and protection circuit for a FET device in accordance with the present disclosure.

As illustrated by the circuit diagram of FIG. 4, ECU 100 may comprise one or more diagnostic circuits 200 configured to identify if a fault or a short exists in the electrical system of the ECU 100. In particular the diagnostic circuit 200 may be configured for determining the existence of a short to ground fault. The diagnostic circuit 200 may include a comparator circuit device 210 in electrical connection with a FET device 230. The comparator circuit 210 may comprise an amplifier that compares input received from the FET device 230 and a reference signal to assist with augmenting detection of a short to ground signal 220. One such comparator circuit device 210 is contemplated in FIG. 4 as being an integrated circuit comparator circuit dual 8-SOIC described as a comparator circuit general purpose CMOS, DTL, ECL, MOS, One-Collector, TTL 8-SO having a manufacturer part number LM2903YDT provided by STMicroelectronics. It is noted that other comparator circuits may be utilized and that the above identified make and model is an exemplary device. In embodiments, the comparator circuit device 210 includes a plurality of pins 214 wherein at least one of the pins 214 may be in electronic communication with the FET device 230. For instance, PIN 2 of the comparator circuit 210 may be coupled to PIN 5 of the FET device 230. As described below, PIN 5 of the FET device 230 may comprise a pin CURRENT_SENSE that may allow for current sensing and diagnostics. In an example, the output at pin CURRENT_SENSE may be proportional to load current, may be a fixed ration of the load current, or the like. It is noted that the current sensed at pin CURRENT_SENSE may be converted to a sensed voltage, such as by connecting a resistor to the pin CURRENT_SENSE.

The diagnostic circuit 200 may also include the FET device 230 which may be a MOSFET. One such Smart-FET device 230 is contemplated in FIG. 4 as being an integrated circuit high side driver 6-HPAK described as a power switch/driver having a manufacturer part number VN5E010AHTR-E provided by STMicroelectronics. This embodiment of the FET device 230 is illustrated and described by FIGS. 1A, 1B, and 1C. It is noted that other or different FET devices may be utilized in accordance with this disclosure. Further, in at least some embodiments the FET device 230 may be a FET without internal protective measures or a Smart-FET that includes internal protective measures.

The FET device 230 may include a packaging or housing 235 with a plurality of pins 240. In one embodiment, the FET device 230 includes seven pins 240 having the following labels: Pin 4 (Vcc), Pin 1 (OUTPUT1), Pin 7 (OUTPUT2), Pin 2 (GND), Pin 3 (INPUT), Pin 6 (CS-DIS), and Pin 5 (CURRENT_SENSE). Pin Vcc may be coupled to a battery, such as a battery of a vehicle.

Pin OUTPUT1 and OUTPUT2 may comprise power outputs that may be coupled together and may be utilized to send output signal 250. In another aspect, the Pin OUTPUT1 and OUTPUT2 may be coupled to a microcontroller 280 as described herein. In some embodiments, Pin OUTPUT1 and pin OUTPUT2 may be an individual output or be combined to produce an output signal 250. FIG. 4 illustrates the output signal 250 identified at J6-13. Microcontroller 280 (which may also be processor 140 Of FIG. 3) is described as being included with diagnostic circuit 200.

Pin GND may be coupled to a ground.

Pin INPUT may be coupled to and receive input from microcontroller 270 via connection SM_50. In an example, Pin INPUT may comprise a voltage controlled input pin with hysteresis that is CMOS compatible and may control output switch state.

Pin CS_DIS may be coupled and generate output to microcontroller 270 via connection M_70. In an example, Pin CS_DIS may comprise an active high CMOS compatible pin that may function to disable the pin CURRENT_SENSE. For instance, when pulled to high, Pin CS_DIS may disable current sensing and diagnostic feedback of the FET Device 230 and may allow sharing of an external sense resistor with other devices.

Pin CURRENT_SENSE may be an analog pin that delivers an output current that is proportional to the load current. In one embodiment, pin CURRENT_SENSE may be in electronic communication with at least one pin 214 from comparator circuit device 210, such as Pin 3. It is noted that a resistor (R6) may be coupled in series with Pin 3 of the comparator circuit device 210 and Pin CURRENT_SENSE. This resistor (R6) may convert the sensed current to a sensed voltage. It should be noted that reference to "sensed current" and "sensed voltage" may be used interchangeably as voltage may be sensed based on sensing current or vice versa. In another aspect, Pin CURRENT_SENSE may be coupled to the microcontroller 280 via connection M_71.

From time to time, use of the FET device 230 may produce a short to ground (signal 220) at output signal 250. In one such situation, defined herein as a comparator circuit interrupt condition: (i) when a short to ground of an output signal occurs, the current through the diagnostic circuit goes high; (ii) the voltage sensed at a Pin CURRENT_SENSE of the FET device 230 is higher than a threshold value TV as set on the inverting input (Pin 2) of the comparator circuit 210; and (iii) an interrupt signal is provided to the microcontroller 280 by Pin 1 of the comparator circuit 210. In one embodiment, the threshold value TV is a reference voltage of the comparator circuit 210 and may be about 3 volts. In other embodiments, the threshold voltage may be different depending on the application and the current and loads of the FET device 230.

As the voltage at pin CURRENT_SENSE exceeds the threshold value TV, an output signal 260 generated at Pin 1 of the comparator circuit 210 (U2-A) goes high. The output signal 260 of the comparator circuit 210 is coupled to input pin 270 (M_46) of the microcontroller 280. In an aspect, the output signal 260 may be configured as a rising edge input interrupt signal. The rising edge input signal 260 may be sensed at an alternative pin 240 of the FET device 230. Upon the sensing of the rising edge input signal 260, the microcontroller 280 identifies the interrupt signal and generates a command to turn off the FET device 230. As described herein, turning off the FET device 230 may refer to placing the FET device 230 in an "off-state" or linear mode where the voltage across the FET device 230 increases and limits the current in the FET device 230. This increased voltage drop across the FET device 230 increases the power dissipation in it and drops the output voltage. It is further noted that turning off the FED device 230 may include disabling a drive signal to the FET device 230, or the like. Moreover, depending on the FET device 230 utilized, the "mode" associated with turning the FET device 230 "off" may go by different of other nomenclatures.

In an example, microcontroller 280 may generate a command signal at Pin M_46 and apply it to pin INPUT of the FET device 230. The FET device 230 responds to the command and turns off. In an embodiment, this function may be performed through the microcontroller 280 as the rising edge input interrupt signal 260 may be communicated through M_46 as illustrated on FIG. 4. The comparator circuit interrupt condition may be applicable for both regular FET devices as well as Smart-FET devices.

Another such situation defined herein is a microcontroller sample condition. The microcontroller sample condition may be used in addition to or alternatively with the comparator circuit interrupt condition within the diagnostic circuit 200. The microcontroller sample condition includes the following features. As a short to ground (signal 220) of the output signal 250 (J6-13) occurs, the current through the FET device 230 may be maintained in the off mode. This may occur in Smart-FET devices as its internal power limitation mode would shut off an output to pin CURRENT_SENSE. This may exist until the short circuit current goes under a power limit threshold value PLTV of the FET device 230. Here, the comparator circuit 210 may not sense the presence of a current but the microcontroller 280 senses if the short circuit current goes over the power limit threshold value PLTV of the FET device 230. Then, the microcontroller 280 functions to detect analog output levels of output signals about 100 microseconds after the FET device 230 is placed in the on mode.

The power limit threshold value PLTV may be defined as a maximum in rush current of the FET device 230 in addition to the current of the desired load in which the diagnostic circuit 200 is intended to be driving. The value of the power limit threshold value PLTV may be different depending on the application and load driven by the FET device 230. In one embodiment, the power limit threshold value PLTV is set with a load of about 4.4 amps having an inrush current of $10x$ which would be approximately 44 amps.

Figure 1C:
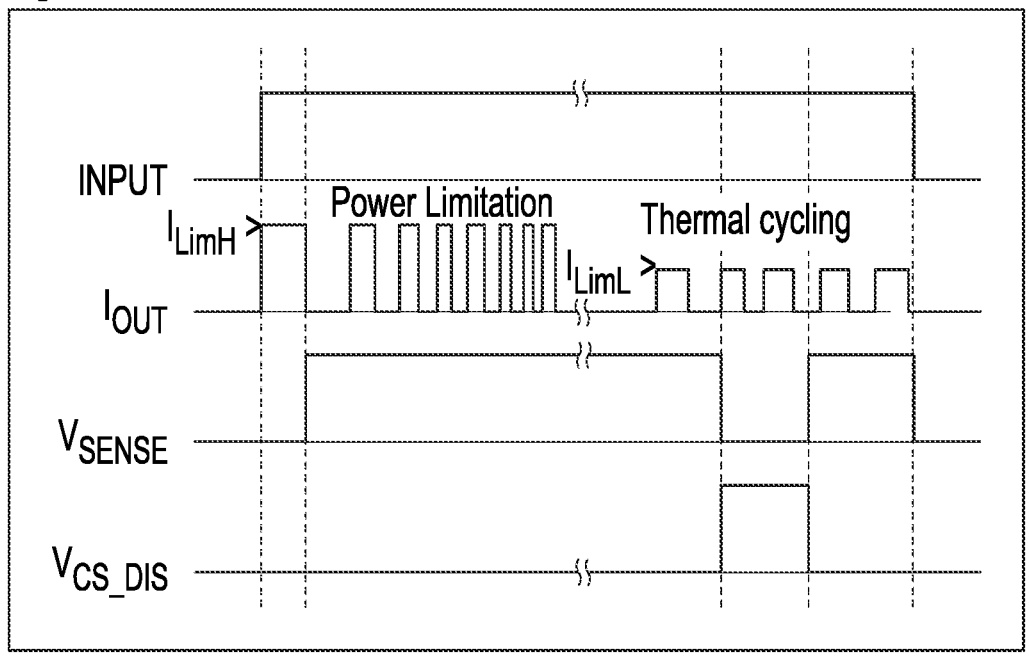
FIG. 1C is a graph that illustrates an existing delay in an overload or short to ground condition of the FET device of FIG. 1A.
Figure 2:
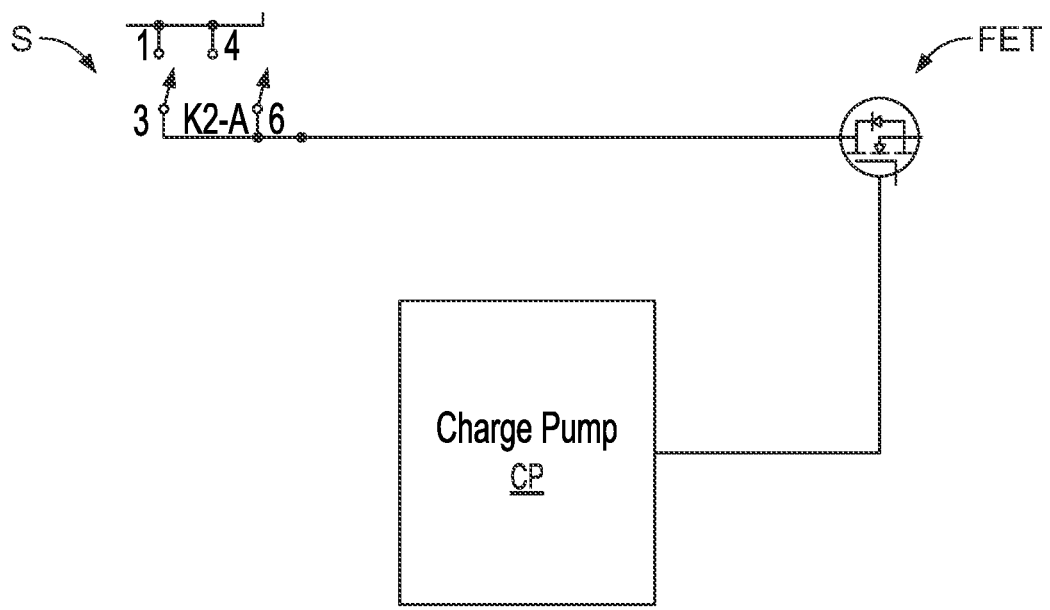
FIG. 2 is a schematic circuitry diagram of a known attempt of protecting an electronic control unit by adding a switch in series with a FET device.

However, if the short circuit current of the output signal 250 is over a current limit ($I_{lim}$) of the FET device 230, pin OUTPUT1 and pin OUTPUT2 of the FET device 230 goes substantially low to limit the power output and the FET device 230 goes into a power limitation mode as identified by FIG. 1C. The power limitation mode of the FET device 230 increases its temperature and stops conducting if such a situation persists. Further, at this point, the comparator circuit device 210 may experience a delay until an output of pin CURRENT_SENSE goes high again. Notably, Pin OUTPUT1 and Pin OUTPUT2 may be in electronic communication with Pin ADC of microcontroller 280. Pin ADC may be an analog to digital channel. Here, microcontroller 280 functions to detect analog output levels of output signal 250. In this instance, the Pin ADC of the microcontroller 280 may function to sample the output signal 250 within about 100 µS to about 200 µS after the FET device 230 is turned on. If the output signal is lower than a voltage threshold this indicated that the FET device 230 is in power limit mode. In such a case, the microcontroller 280 turns off the input to the FET device 230. Such a threshold value may be defined as a value indicating that the FET device 230 is in a power limit mode. In an embodiment, the threshold may be about 6 volts. It is noted that other embodiments may utilize different thresholds based on the FET device and application of the ECU 100.

Thus, under both conditions (e.g., condition 1—the comparator circuit interrupt condition when the load current is less than or equal to $I_{lim}$, and condition 2—microcontroller sample condition) when either (i) the current load of the output signal 250 is less than or equal to a current limit of the FET device 230 and (ii) the current load of the output signal 250 is greater than a current limit of the FET device 230, the diagnostic circuit 200 will function to shut off the FET device 230. It is noted that some embodiments may shut off the FET device 230 within about 100 μS if a short to ground is detected at the output signal 250.

Moreover, the short to ground of the FET device 230 may be detected via the diagnostic circuit 200, whether the short condition is present (e.g., occurs) before or after the FET device 230 is turned on. For instance, the short to ground may be detected via an interrupt by the comparator circuit 210. As such, the detection occurs whether the short to ground is present before the FET device 230 is turned on or occurs after the FET device is turned on. In the case where a short to ground is present after the FET device 230 is turned on, the detection of such a short may be within about 50-2000 (typical) for a current load that is less than or equal to a current limit where the typical current limit of the FET device 230 (e.g., about 85 amps in some embodiments). In the case where a short to ground is present before the FET device 230 is turned on, the detection of such a short will always be between about 50-2000 after the FET device 230 is turned on regardless of the current load of the FET device 230 (e.g., whether it is less than or equal to a current limit or not).

As described here and elsewhere in this disclosure, the microcontroller 280 may iterate attempts to turn the FET device 230 on or otherwise check for a short to ground condition. If the short to ground condition is persistent, the microcontroller 280 may attempt to turn the FET device 230 on or off less frequently. As an example, the microcontroller 280 may attempt to turn the FET device 230 on for a first number of times (e.g., 2, 3, 4, etc.) on a first frequency (e.g., every 10 milliseconds). If, on the first number of times, there is still a short to ground condition, the microcontroller 280 may then lengthen the time between attempts, such as iterating every one second. It is noted that the microcontroller 270 may use any number of frequencies and may adjust the frequencies any number of times. As an example, the microcontroller 280 may attempt to turn on the FET device 230 every t+1 milliseconds, such that the period between attempts increases every attempt.

Figure 5:
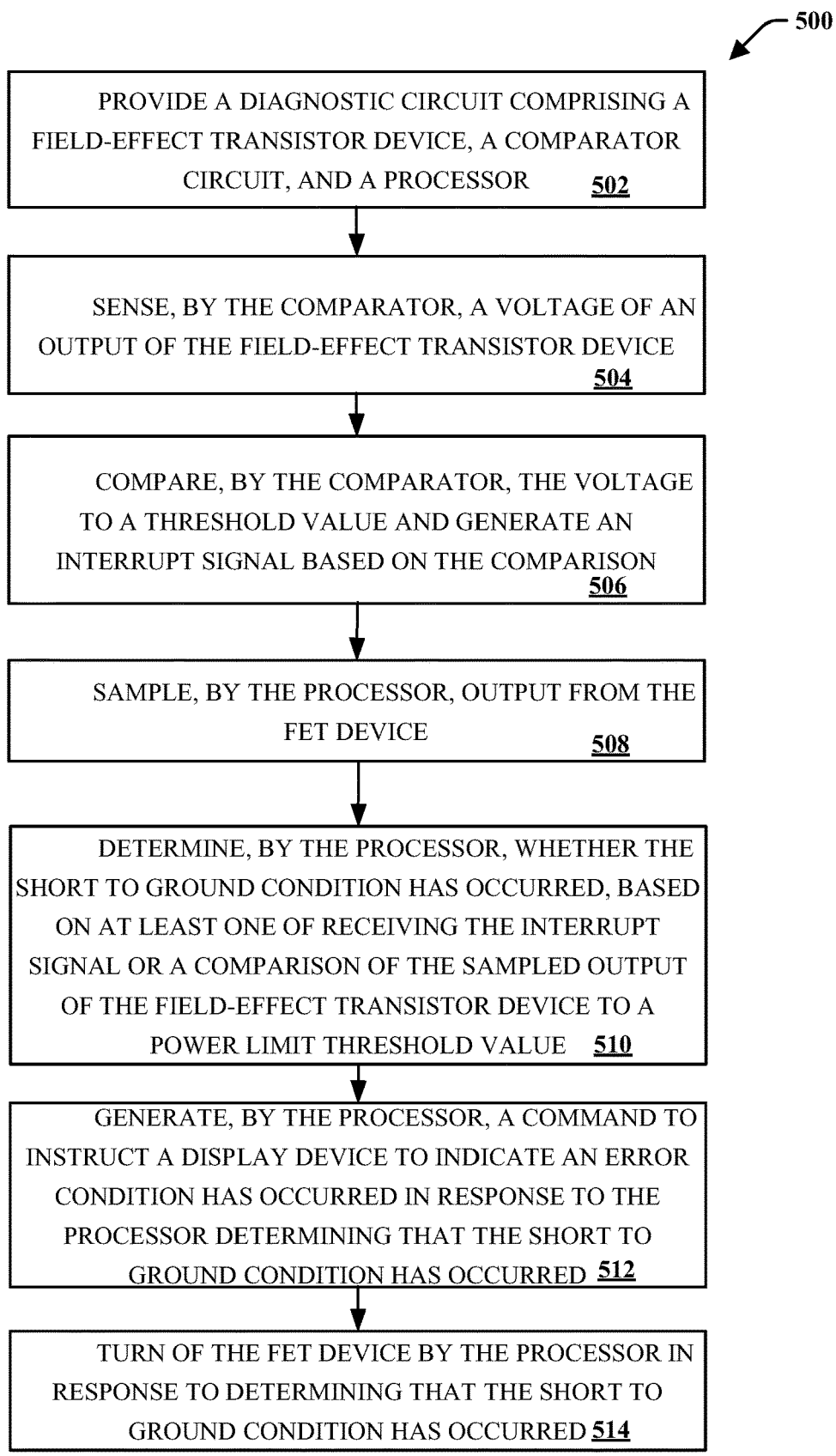
FIG. 5 is a method associated with the diagnostic and protection circuit in accordance with the present disclosure.

In view of the subject matter described herein, methods that may be related to various embodiments may be better appreciated with reference to the flowchart of FIG. 5. While the method is shown and described as a series of blocks, it is noted that associated methods or processes are not limited by the order of the blocks. It is further noted that some blocks and corresponding actions may occur in different orders or concurrently with other blocks. Moreover, different blocks or actions may be utilized to implement the methods described hereinafter. Various actions may be completed by one or more of users, mechanical machines, automated assembly machines (e.g., including one or more processors or computing devices), or the like.

FIG. 5 depicts an exemplary flowchart of non-limiting method 500 associated with a circuit comprising a FET device, according to various aspects of the subject disclosure. As an example, method 500 may be utilized to protect a circuit comprising a FET device from short to ground conditions. While aspects of the method may be suitable for various implementations, aspects may be particularly well suited for automotive applications.

At 502, the method may provide a diagnostic circuit comprising a field-effect transistor device, a comparator circuit, and a processor. In examples, the diagnostic circuit may comprise the diagnostic circuit of FIG. 3 or 4. It is noted that the method may include providing the diagnostic circuit within or coupled to an electronic control unit of an automobile.

At 504, the method may comprise sensing, by the comparator, a voltage of an output of the field-effect transistor device. It is noted that sensing may include receiving a signal having a voltage value. The signal may be output from a FET device, such as a current sense or diagnostic output. As described herein, a resistor may be coupled to the FET device output to convert the sensed current into a sensed voltage.

At 506, the method may comprise comparing, by the comparator, the voltage to a threshold value and generating an interrupt signal based on the comparison. It is noted that the threshold value may be a threshold voltage, such as i volts, where i is a number (e.g., 1, 2, 3, 4, etc.). In some embodiments, the comparator may compare a sensed current to a threshold current.

At 508, the method may include sampling, by the processor, output from the FET device. Sampling may include receiving a reading from an output line or pin(s) of the FET device. It is noted that the processor may sample the output in response to a triggering event. A triggering event may include the FET device turning on, passage of time, receiving a signal, or the like.

At 510, the method may include determining, by the processor, whether the short to ground condition has occurred, based on at least one of receiving the interrupt signal or a comparison of the sampled output of the field-effect transistor device to a power limit threshold value. It is noted that the processor may execute instructions stored in memory to determine whether the short to ground condition has occurred.

At 512, the method may include generating, by the processor, a command to instruct a display device to indicate an error condition has occurred in response to the processor determining that the short to ground condition has occurred. The display device may include an interface on a dash of an automobile as described herein. It is further noted that the command may be communicated via a bus, such as a bust of an automobile.

At 514, the method may include further comprising turning of the FET device by the processor in response to determining that the short to ground condition has occurred.

It is further noted that, while various components are described as separate components, such components may be packaged or grouped together. For instance, the FET device may include or incorporate the comparator within the FET device (e.g., on a single IC). In another example, the microcontroller may include the comparator within its packaging. Moreover, the microcontroller may be coupled to a FET device in various other manners and may compare sensed parameters within the microcontroller.

Accordingly, modification of the disclosure will occur to those skilled in the art and to those who make or use the invention, including, without limitation, the values provided for the various elements disclosed above. It should be understood that such values are exemplary values and the present invention is not limited to those values. Therefore, it is understood that the embodiments shown in the drawings and described above are merely for illustrative purposes and not intended to limit the scope of the invention, which is defined by the following claims as interpreted according to the principles of patent law, including the Doctrine of Equivalents.

The invention claimed is:

1. A diagnostic circuit for an electronic control unit comprising:
a field-effect transistor device operatively coupled to a power source and comprising a current sense output;
a comparator circuit coupled to the field-effect transistor and operatively receiving a sensed parameter of a first output signal of the signal field-effect transistor, wherein the comparator circuit compares the sensed parameter to a reference value and generates an interrupt signal in response to the sensed parameter exceeding the reference value; and
a microprocessor coupled to the comparator circuit and the field-effect transistor device, wherein the microprocessor, in response to receiving the interrupt signal, shuts off the field-effect transistor device, and, in response to turning off the field-effect transistor device, turns the field-effect transistor device on after a first period of time and reiterates shutting off the field-effect transistor device if an interrupt signal is received, and wherein the microprocessor further iterates turning the field-effect transistor device on and off for a threshold amount of periods, and in response to reaching the threshold amount of periods with a ground to short condition maintained, utilizes an alternative period that is greater in length than the first period.

2. The diagnostic circuit of claim 1, wherein the sensed parameter comprises a sensed voltage and the reference value comprises a reference voltage, and wherein the comparator circuit compares the sensed voltage to the reference voltage.

3. The diagnostic circuit of claim 1, wherein the field-effect transistor device generates the first output signal with the sensed parameter that exceeds the reference value when a short to ground condition occurs.

4. The diagnostic circuit of claim 1, wherein the microprocessor is further coupled to an output pin of the field-effect transistor device to receive a second output signal of the field-effect transistor device.

5. The diagnostic circuit of claim 4, wherein the microprocessor samples the second output signal to determine whether a short to ground condition has occurred, and, in response to determining that the short to ground condition has occurred, turns off the field-effect transistor device.

6. The diagnostic circuit of claim 5, wherein determining whether the short to ground condition has occurred comprises comparing the sampled second output signal to a power limit threshold value.

7. The diagnostic circuit of claim 5, wherein the microprocessor samples the second output signal after the field-effect transistor device is placed in the on mode.

8. The diagnostic circuit of claim 1, wherein the field-effect transistor device comprises a field-effect transistor device of at least one of a trailer brake control circuit, a light control circuit, or an antilock brake control circuit.

9. The diagnostic circuit of claim 1, wherein the microprocessor further comprises a memory, wherein the memory stores executable instructions that, when executed, enables the microprocessor to communicate over an automotive bus system.

10. The diagnostic circuit of claim 1, wherein the comparator circuit is comprised by at least one of the microprocessor or the field-effect transistor device.

11. The diagnostic circuit of claim 1, wherein the first period of time comprises ten milliseconds.

12. A system for diagnosing and protecting a field-effect transistor device from a short to ground event comprising:
a diagnostic circuit that comprises:
a field-effect transistor device operatively coupled to a power source and a driven device, wherein the field-effect transistor device operatively delivers a load to the driven device;
a comparator circuit coupled to an output channel of the field-effect transistor device; and
a microprocessor coupled to the comparator circuit and the field-effect transistor device;
wherein the microprocessor receives input from the field-effect transistor device and the comparator circuit, and wherein the microprocessor determines whether a short to ground condition is present based the input received from at least one of from the field-effect transistor device or the comparator circuit, and in response turns off the field-effect transistor device within a threshold time, and wherein the microprocessor determines whether the short to ground condition is present prior to turning the field-effect transistor device on and after turning the field-effect transistor device on.

13. The system of claim 12, wherein the threshold time 1s between about 100 microseconds and about 500 microseconds.

14. The system of claim 12, wherein the microprocessor turns off the field-effect transistor device by disabling a drive signal to the field-effect transistor device.

15. The system of claim 12, wherein the comparator generates an interrupt signal based on determining that a sensed voltage of an output signal of the field-effect transistor device exceeds a threshold voltage.

16. The system of claim 15, wherein the threshold voltage is about 3 volts.

17. The system of claim 12, wherein the field-effect transistor device comprises a smart field-effect transistor device.

18. A method of detecting a short to ground condition in a circuit comprising a field-effect transistor device, the method comprising:
providing a diagnostic circuit comprising a field-effect transistor device, a comparator circuit, and a processor;
sensing, by the comparator, a voltage of an output of the field-effect transistor device;
comparing, by the comparator, the voltage to a threshold value and generating an interrupt signal based on the comparison;
sampling, by the processor, output from the field-effect transistor device;
determining, by the processor, whether the short to ground condition has occurred, based on at least one of receiving the interrupt signal or a comparison of the sampled output of the field-effect transistor device to a power limit threshold value; and
turning off the field-effect transistor device within a threshold time, by the processor, when the processor determines that the short to ground condition has occurred, wherein the processor determines whether the short to ground condition has occurred prior to turning the field-effect transistor device on and after turning the field-effect transistor device on.

19. The method of claim 18, further comprising generating, by the processor, a command to instruct a display device to indicate an error condition has occurred in response to the processor determining that the short to ground condition has occurred.

20. The method of claim 18, further comprising providing the diagnostic circuit within an electronic control unit of an automobile.

* * * * *